United States Patent [19]

Hadwiger et al.

[11] Patent Number: 5,044,074

[45] Date of Patent: * Sep. 3, 1991

[54] METHOD FOR MANUFACTURING METAL CORE PRINTED CIRCUIT BOARDS

[75] Inventors: Helmut Hadwiger, Munich; Hans Schmidt, Eurasburg, both of Fed. Rep. of Germany

[73] Assignee: Siemens Aktiengesellschaft, Munich, Fed. Rep. of Germany

[ * ] Notice: The portion of the term of this patent subsequent to May 15, 2007 has been disclaimed.

[21] Appl. No.: 495,740

[22] Filed: Mar. 16, 1990

Related U.S. Application Data

[62] Division of Ser. No. 291,119, Dec. 28, 1988, Pat. No. 4,924,590.

[30] Foreign Application Priority Data

Jan. 8, 1988 [DE] Fed. Rep. of Germany ........ 3800348

[51] Int. Cl.$^5$ .............................................. H05K 1/05
[52] U.S. Cl. ..................................... 29/848; 156/324; 174/250; 427/97; 428/458; 428/461; 428/473.5
[58] Field of Search .......................... 29/846, 848, 834; 361/414; 427/96; 428/458, 473.5, 461; 156/308.6, 309.3, 324

[56] References Cited

U.S. PATENT DOCUMENTS

| | | |
|---|---|---|
| 3,589,975 | 6/1971 | Andrews et al. ............... 156/324 X |
| 3,932,932 | 1/1976 | Goodman . |
| 3,934,334 | 1/1976 | Hanni . |
| 3,934,335 | 1/1976 | Nelson . |
| 3,958,317 | 5/1976 | Peart et al. .................... 428/473.5 X |
| 4,492,730 | 1/1985 | Oishi et al. ...................... 428/461 X |
| 4,543,295 | 9/1985 | St. Clair et al. ..................... 428/458 |
| 4,601,916 | 7/1986 | Arachtingi . |
| 4,663,208 | 5/1987 | Ninomiya et al. . |
| 4,694,120 | 9/1987 | Accou . |
| 4,777,721 | 10/1988 | Choinski . |
| 4,791,248 | 12/1988 | Oldenettel . |

FOREIGN PATENT DOCUMENTS

| | | |
|---|---|---|
| 0296179A3 | 12/1986 | European Pat. Off. . |
| 1432771 | 2/1966 | France . |
| 57-187247 | 11/1982 | Japan .................................. 428/458 |
| 63-267542 | 11/1988 | Japan .................................. 428/458 |
| 2000913A | 1/1979 | United Kingdom . |

OTHER PUBLICATIONS

"Allgemeines und Anwendungsgebiete", by G. Hermann, 1982, pp. 313-329.

*Primary Examiner*—Carl J. Arbes
*Attorney, Agent, or Firm*—Hill, Van Santen, Steadman & Simpson

[57] ABSTRACT

A method for the manufacturing of a metal core pc board which provides for manufacturing of two or three dimensional metal core pc boards of any form. The manufacturing of such pc boards can occur by injection molding, injection/compression methods or by a pressing method. High-heat resistant thermoplastics, as well as thermoset plastics are preferably used as pc board materials. A metal with good thermal conductibility is used for the core. The material is selected such that the thermal expansion coefficients of the metal core and the pc board material are optimally equal. The manufacturing contains the following steps: lamination of the metal plate with a plastic foil on one or both sides; placing of such prepared metal core in an injection molding tool; and thermoforming the plastic on the laminated core over the plastic foil.

22 Claims, 1 Drawing Sheet

METHOD FOR MANUFACTURING METAL CORE PRINTED CIRCUIT BOARDS

CROSS REFERENCE TO RELATED APPLICATIONS

This is a divisional of U.S. Ser. No. 291,119, filed Dec. 28, 1988 (now U.S. Pat. No. 4,924,590) and assigned to the same assignee as the present invention.

BACKGROUND OF THE INVENTION

The present invention relates to a method for the manufacturing of a metal core pc board whose core is composed of a metal with good thermal conductibility, preferably aluminum, copper, brass or steel, whereby the thermal expansion coefficients of the metal core and other pc board materials are optimally equal.

In the case of large scale integration (LSI) components or power components, the elimination of heat that accumulates in the components is a significant problem which can be solved with the integration of a metal core in the printed circuit board. The metal core provides better thermal conductivity for the pc board connected therewith.

Prior manufacturing methods used for metal cores are: coating of the metal core with expoxide-resin powder by powder painting; electro-static coating of the metal core; electrophoretic coating of the metal core; dip-coating of the metal core; and core lamination. The term electro-phoretic refers to the transport of charged particles in non-conductive fluid under the influence of an electrical voltage.

These methods and their advantages and disadvantages are described in G. Hermann, Hanbuch der Leiterplattentechnik, chapter 17, second edition, Eugen G. Lenze publishing company, Saulgau, 1982.

The metal core pc boards manufactured in this manner have particular weak points in the throughplating.

SUMMARY OF THE INVENTION

An object of the present invention is to provide a method for the manufacturing of a metal core pc board.

The prior art problem is solved according to the method and apparatus of the present invention.

The method has the steps of manufacturing the pc boards of any form on a plastic by thermoforming, whereby the metal core is laminated with a plastic foil, such as a high temperature resistent plastic foil at least on one side of the metal core, this laminated metal core being then placed into a shaping tool and enveloped at least one one side with plastic, such as a thermoset plastic or thermoplastic, on the plastic foil, and at least partially in a thermoforming process, such as an injection molding process, injection coining process or a pressing process.

The metal core pc board has the following structure: a metal core; a plastic foil that is applied to the metal core by means of adhesives at least on one side; and a plastic applied to the prepared metal core by a thermoforming method at least on one side. Also, when the metal core pc board has hollow-cylindrical holes in the metal core, the difference between the holes constructed with an over dimension and their final dimension, is also composed of plastic.

The essential advantage of the present invention is that the number of manufacturing steps is decreased, and the cited disadvantage does not occur. Furthermore, sealed plastic surfaces are present at any throughplatings so that a uniform metalization of the through-platings is guaranteed. According to the method of the present invention pc boards with insulated outer contours can be manufactured without additional cost or equipment.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures in which like reference numerals identify like elements, and in which:

DESCRIPTION OF THE PREFERRED EMBODIMENT

Figure 1:
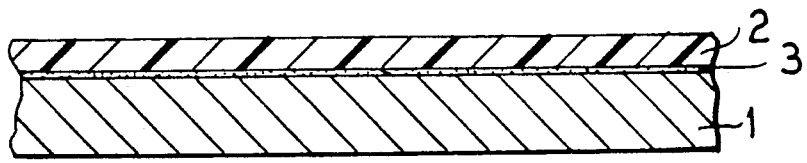
FIG. 1 is a cross-sectional view of a portion of a metal core pc board constructed according to the method of the present invention showing a plastic film attached to a metal core by an adhesive.
Figure 2:
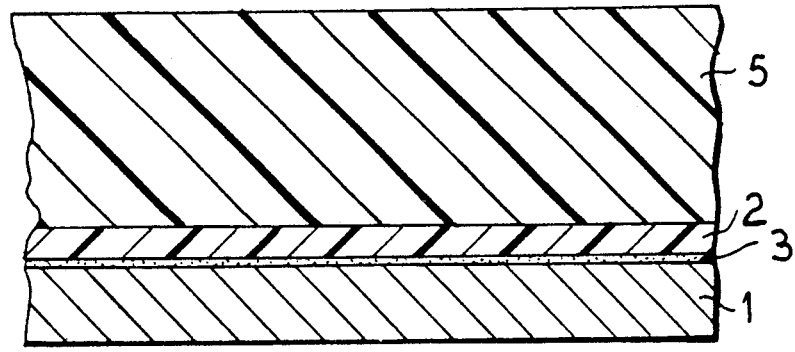
FIG. 2 is a cross-sectional view showing an additional plastic layer applied over the plastic film.
Figure 3:
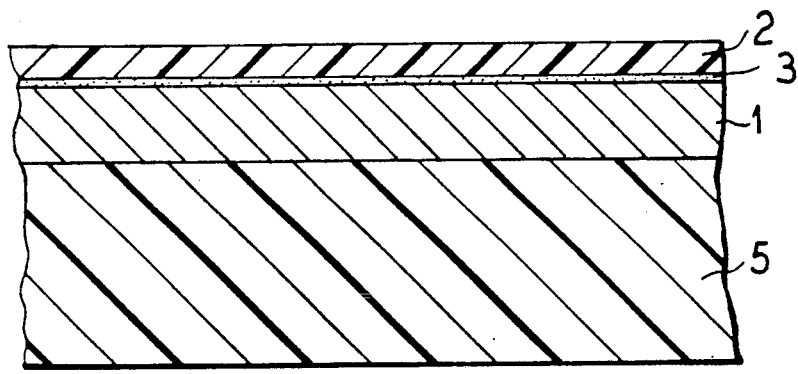
FIG. 3 is a cross-sectional view showing an additional plastic layer applied directly to a side of the metal core.
Figure 4:
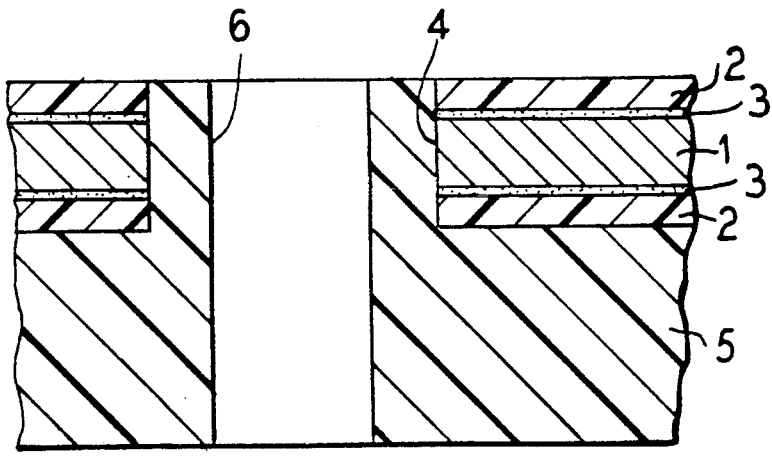
FIG. 4 is a cross-sectional view showing the plastic film and additional plastic layer applied to both sides of the metal core.

An aluminum plate serves as metal core 1, this aluminum plate being laminated on both sides with a plastic foil 2, as shown in FIG. 4 and on only one side as shown in FIGS. 1-3. An adhesive 3 is provided between the metal core 1 and the plastic foil 2 (for example, see FIG. 1). The adhesive may be a type of adhesive which has high temperature resistance. The laminated plate may be bored or a desired hole pattern with a corresponding over sized dimension may be pressed or punched into the laminated metal plate (see FIG. 4). A boring is denoted by reference numeral 4. The pc board is subsequently enveloped on one side in an injection molding tool with a plastic 5. This plastic 5 is preferably a thermoplastic. Thermoplastic is one subgroup of plastics. Also useable is another subgroup of plastics known as thermoset plastic. Thereby, the holes 4 are insulated and filled out to the final dimension 6 (see FIG. 4). Due to the enveloping, the foil 2 is tightly melted to the thermoplastic 5 at all contact surfaces.

The metal core pc boards can be two or three dimensional. The molding method mentioned above can be replaced by an injection/compression molding method or by a pressing method. The metal core 1 can be laminated with the plastic foil 2 on one side (see FIGS. 1-3) or on both sides, (see FIG. 4) and can also be coated with the plastic 5 on one side (see FIGS. 2 and 3) or on both sides (see FIG. 4). Typically, the plastic foil 2 is used as a base for the application of the plastic 5. The selection of the materials is structured such that the metal core has a high thermal conductibility, and that the matching of the different, applied materials i.e. the combination of metals and plastics regarding the different thermal expansion coefficients of the individual components have no great deviation. Thermal stress, caused by heat expansions in or between different layers, has disadvantageous effects but is prevented by the present invention. In the embodiment depicted in FIG.

4 the metal core 1 of a metal core pc board that is prepared with plastic foil is enveloped with the plastic 5 within its holes 4 and planarly proceeding from one side. Thus, an outside and all-around insulation of the pc board can be produced at the same time.

It is also possible to only extend the metal core 1 over a small part of the entire pc board, or to coat the metal core 1 only partially by means of the plastic 5. Regarding the FIG. 4 embodiment the final dimension of the holes 4 that were bored or pressed with an over sized dimension, is obtained by the plastic 5 in the thermoforming method, whereby the final dimension is achieved by using pins of the desired diameter in a tool. Thus, metal core pc boards can be manufactured with a certain hole pattern. However, for the application as a housing part or for the equipping with strictly surface mountable components, a metal core pc board can be manufactured without holes 4 by means of the method of the present invention as depicted in FIGS. 1-3.

The plastics that are utilized for the plastic foil 2 and the plastic 5 are selected such that the same method can be applied both for the metalization and for the manufacturing of the interconnects. If, for example, the chemical substance polyetherimide is used as plastic for the plastic foil 2 and the plastic 5, standard electroplating methods which are offered by various firms and which usually involve one or several pre-treatment baths, or one main treatment bath can be used for this metalization of polyetherimide. Polyetherimide belongs to the group of thermoplastics.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

What is claimed is:

1. A method for the manufacturing of a metal core pc board whose core is composed of a metal with good thermal conductibility, preferably one of aluminum, copper, brass or steel, the thermal expansion coefficients of the metal core and other pc board materials being substantially equal, comprising the steps of: laminating the metal core with a plastic foil at least on one side; placing the laminated metal core into a shaping tool; and enveloping the laminated metal core at least on one side with an additional plastic layer and at least partially in a thermoforming process.

2. The method according to claim 1, wherein the metal core only extends over a part of the pc board.

3. The method according to claim 1, wherein the enveloping by means of the additional plastic layer occurs only partially.

4. The method according to claim 1, wherein thermoplastic is used as the additional plastic layer.

5. The method according to claim 1, wherein the laminated plastic foil and the additional plastic layer that serves for the enveloping are composed of the same kind of plastic.

6. The method according to claim 1, wherein adhesives in the form of adhesive foils are used for the application of the laminated plastic foil.

7. The method according to claim 6, wherein the adhesives are high-temperature resistant.

8. The method according to claim 6, wherein liquid adhesives are used for the application of the laminated plastic foil.

9. The method according to claim 8, wherein the adhesives are high-temperature resistant.

10. The method according to claim 1, wherein the plastic foil is applied without adhesive by roller lamination after corresponding pretreatment of the metal core, for example with a coupling agent or treatment.

11. The method according to claim 1, wherein the plastic foil is applied to one side of the metal core and the additional plastic layer is applied to the other opposed side of metal core.

12. A method for the manufacturing of a metal core pc board whose core is composed of a metal with good thermal conductibility, the thermal expansion coefficients of the metal core and other pc board materials being substantially equal, comprising the steps of: laminating a metal core with a high temperature resistant plastic foil at least on one side of the metal core; placing the laminated metal core into a shaping tool; and thermoforming in the shaping tool an additional plastic layer onto at least said one side of said laminated core over said plastic foil.

13. The method according to claim 12, wherein the metal core only extends through a part of the pc board.

14. The method according to claim 12, wherein the additional plastic layer is thermoformed only partially over said one side.

15. The method according to claim 12, wherein said additional plastic layer is a thermoset plastic.

16. The method according to claim 12, wherein said additional plastic layer is a thermoplastic.

17. The method according to claim 12, wherein the laminated plastic foil and the additional plastic layer are composed of the same kind of plastic.

18. The method according to claim 12, wherein adhesives in the form of adhesive foils are used for the application of the laminated plastic foil.

19. The method according to claim 18, wherein the adhesives are high-temperature resistant.

20. The method according to claim 12, wherein liquid adhesives are used for the application of the laminated plastic foil.

21. The method according to claim 20, wherein the adhesives are high-temperature resistant.

22. The method according to claim 12, wherein the plastic foil is applied without adhesive by roller lamination after corresponding pretreatment of the metal core.

* * * * *